(12) United States Patent
Baykan et al.

(10) Patent No.: US 12,266,536 B2
(45) Date of Patent: Apr. 1, 2025

(54) MID-PROCESSING REMOVAL OF SEMICONDUCTOR FINS DURING FABRICATION OF INTEGRATED CIRCUIT STRUCTURES

(71) Applicant: Intel Corporation, Santa Clara, CA (US)

(72) Inventors: Mehmet O. Baykan, Beaverton, OR (US); Anurag Jain, Portland, OR (US); Szuya S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/216,984

(22) Filed: Jun. 30, 2023

(65) Prior Publication Data

US 2023/0343599 A1    Oct. 26, 2023

Related U.S. Application Data

(63) Continuation of application No. 16/631,345, filed as application No. PCT/US2017/052002 on Sep. 18, 2017, now Pat. No. 11,887,860.

(51) Int. Cl.
| | | |
|---|---|---|
| H01L 21/308 | (2006.01) | |
| H01L 21/8238 | (2006.01) | |
| H01L 27/092 | (2006.01) | |
| H01L 29/10 | (2006.01) | |
| H01L 29/161 | (2006.01) | |
| H01L 29/20 | (2006.01) | |

(52) U.S. Cl.
CPC ...... *H01L 21/3088* (2013.01); *H01L 21/3085* (2013.01); *H01L 21/3086* (2013.01);
(Continued)

(58) Field of Classification Search
CPC ............. H01L 21/3088; H01L 21/3085; H01L 21/3086; H01L 21/823807;
(Continued)

(56) References Cited

U.S. PATENT DOCUMENTS

2013/0277720 A1* 10/2013 Kim ............... H01L 29/785
257/288
2013/0277760 A1 10/2013 Lu
(Continued)

FOREIGN PATENT DOCUMENTS

| KR | 1020110114857 | 10/2011 |
|---|---|---|
| WO | WO-2019055041 | 3/2019 |

OTHER PUBLICATIONS

Notice of Allowance from U.S. Appl. No. 16/631,345, filed Sep. 20, 2023, 9 pgs.
(Continued)

*Primary Examiner* — Cuong B Nguyen
(74) *Attorney, Agent, or Firm* — Schwabe, Williamson & Wyatt P.C.

(57) ABSTRACT

Techniques are disclosed for forming integrated circuit structures having a plurality of semiconductor fins, which in turn can be used to form non-planar transistor structures. The techniques include a mid-process removal of one or more partially-formed fins. The resulting integrated circuit structure includes a plurality of semiconductor fins having relatively uniform dimensions (e.g., fin width and trough depth). In an embodiment, the fin forming procedure includes partially forming a plurality of fins, using a selective etch stop built into the semiconductor structure in which the fins are being formed. One or more of the partially-formed fins are removed via sacrificial fin cut mask layer(s). After fin removal, the process continues by further etching trenches between the partially-formed fins (deep etch) to form portion of fins that will ultimately include transistor channel portion. A liner material may be deposited to protect the partially-formed fins during this subsequent deep trench etch.

18 Claims, 6 Drawing Sheets

(52) U.S. Cl.
CPC .......... *H01L 21/823807* (2013.01); *H01L 21/823821* (2013.01); *H01L 27/0924* (2013.01); *H01L 29/1037* (2013.01); *H01L 29/161* (2013.01); *H01L 29/20* (2013.01)

(58) Field of Classification Search
CPC ......... H01L 21/823821; H01L 27/0924; H01L 29/1037; H01L 29/161; H01L 29/20; H01L 29/7853; H01L 21/823431; H01L 29/66795; H01L 29/785
See application file for complete search history.

(56) References Cited

U.S. PATENT DOCUMENTS

| | | |
|---|---|---|
| 2013/0309838 A1 | 11/2013 | Wei |
| 2015/0340238 A1 | 11/2015 | Xie |
| 2016/0043081 A1 | 2/2016 | Wei |
| 2016/0293697 A1 | 10/2016 | Kim |
| 2016/0379982 A1* | 12/2016 | You .............. H01L 29/0657 257/369 |
| 2017/0236722 A1 | 8/2017 | Fan |
| 2018/0069003 A1 | 3/2018 | Cheng |
| 2019/0067112 A1 | 2/2019 | Liang |

OTHER PUBLICATIONS

International Preliminary Report on Patentability received for PCT Application No. PCT/US2017/052002 mailed Apr. 2, 2020, 10 pages.
International Search Report and Written Opinion received for PCT Application No. PCT/US2017/052002 mailed Jun. 18, 2018, 13 pages.

* cited by examiner

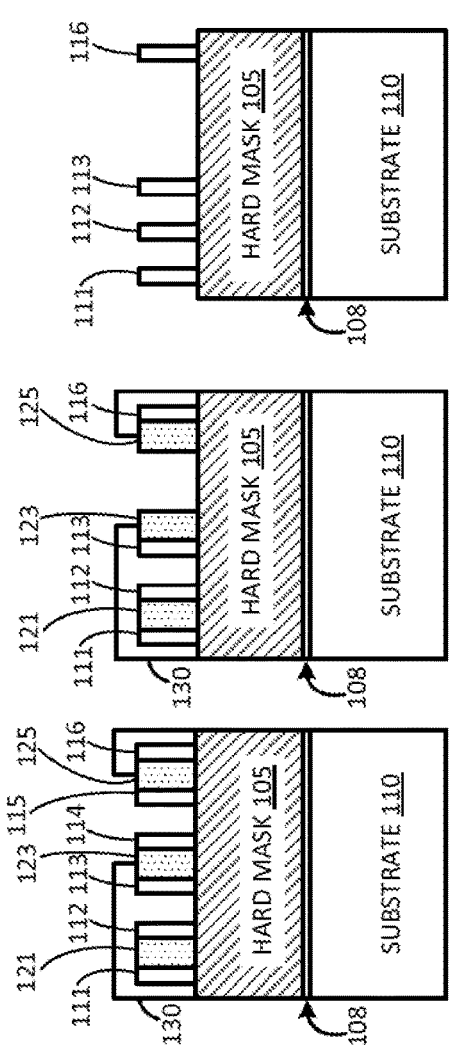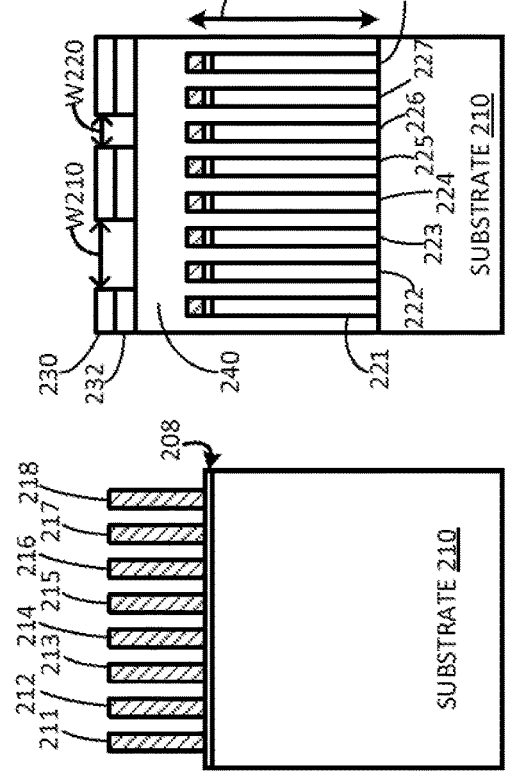

MID-PROCESSING REMOVAL OF SEMICONDUCTOR FINS DURING FABRICATION OF INTEGRATED CIRCUIT STRUCTURES

CROSS-REFERENCE TO RELATED APPLICATION

This patent application is a continuation of U.S. patent application Ser. No. 16/631,345, filed Jan. 15, 2020, which is a U.S. National Phase Application under 35 U.S.C. § 371 of International Application No. PCT/US2017/052002, filed Sep. 18, 2017, entitled "MID-PROCESSING REMOVAL OF SEMICONDUCTOR FINS DURING FABRICATION OF INTEGRATED CIRCUIT STRUCTURES," which designates the United States of America, the entire disclosures of which are hereby incorporated by reference in their entirety and for all purposes.

BACKGROUND

Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include side-wall or so-called gate spacers on either side of the gate that can help determine the channel length and can help with replacement gate processes, for example. Complementary MOS (CMOS) structures typically use a combination of p-type MOSFETs (p-MOS) and n-type MOSFETs (n-MOS) to implement logic gates and other digital circuits.

A finFET is a non-planar transistor built around a thin strip of semiconductor material (generally referred to as a fin). The transistor includes the standard FET nodes, including a gate, a gate dielectric, a source region, and a drain region. Because the conductive channel of such configurations includes three different planar regions of the fin, such a finFET design is sometimes referred to as a tri-gate transistor. Tri-gate transistors are one example of non-planar transistor configurations, and other types of non-planar configurations are also available, such as so-called double-gate transistor configurations, in which the conductive channel principally resides along the two sidewalls of the fin (and not along the top of the fin). Another non-planar transistor configuration is a gate-all-around configuration, which is configured similarly to a fin-based transistor, but instead of a finned channel region where the gate is on three portions (and thus, there are three effective gates), one or more nanowires (or nanoribbons) are used and the gate material generally surrounds each nanowire. The nanowires/nanoribbons can be made from larger fin structures. In any such cases, creating integrated circuit structures having semiconductor fins that are very closely spaced and removing certain fins at undesired locations involves a number on non-trivial issues.

BRIEF DESCRIPTION OF THE DRAWINGS

FIGS. 1A-1E illustrate example cross-sectional views of integrated circuit structures resulting from a first comparative technique (referred to herein as a fin trim first process) for forming a plurality of semiconductor fins. The cross-section is taken through the substrate and the semiconductor fins, and perpendicular to the fins.

FIG. 2A-2D illustrate example cross-sectional views of integrated circuit structures resulting from a second comparative technique (referred to herein as a fin trim last process) for forming a plurality of semiconductor fins. The cross-section is taken through the substrate and the semiconductor fins, and perpendicular to the fins.

Figure 3A:
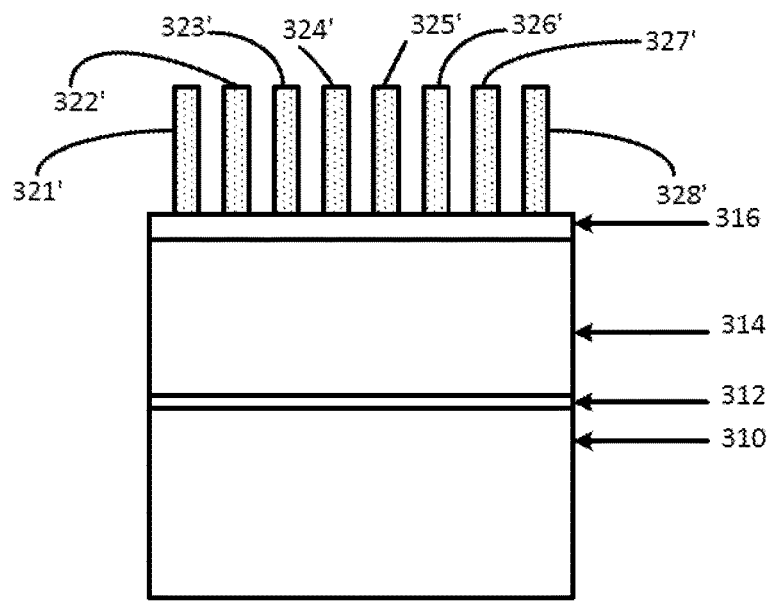
FIGS. 3A-3E illustrate example cross-sectional views of integrated circuit structures resulting from a method configured to form a plurality of semiconductor fins, including a mid-process fin trim to remove one or more of partially-formed fins, in accordance with an embodiment of the present disclosure. The cross-section is taken through the substrate and the semiconductor fins, and perpendicular to the fins.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming integrated circuit structures having a plurality of semiconductor fins, which in turn can be used to form non-planar transistor structures. The techniques include a mid-process removal of one or more partially-formed fins. By carrying out fin removal mid-process, issues associated with fin trim first and fin trim last processes are avoided. The resulting integrated circuit structure includes a plurality of semiconductor fins having relatively uniform dimension (including fin width as well as fin trench depth), notwithstanding the fact that at least one or more semiconductor fins were removed from among the plurality of remaining semiconductor fins. According to an embodiment, one or more of the plurality of semiconductor fins are removed during a mid-processing (also referred to herein as "mid-process" or "in-situ") fin trim process. The process includes partially forming a plurality of fins, using a selective etch stop built into the semiconductor structure in which the fins are being formed. With the partially-formed fins in place, the process continues with depositing a sacrificial pattern blocking material over and in between the plurality of partially-formed fins. One or more sacrificial fin cut mask layers are deposited and patterned on the sacrificial pattern blocking material, and at least one of the partially-formed fins are removed via an opening in the one or more sacrificial fin cut mask layers. Once the partially-formed fins targeted for removal are removed, the remaining sacrificial pattern blocking material is then removed. At this point, the process can be continued, by further etching the trenches between the partially-formed fins. In some embodiments, a liner material is deposited on the partially-formed fins to protect the partially-formed fins during this subsequent deep trench etch. Note that the liner may further serve to effectively control the width of the final fully-formed fins. The process can be divided into a first etch that is selective to the etch stop layer within the fin structure to form the partial-fins, and a second etch that is selective to the liner (if present) to form the remainder of the fin. The in-situ fin trim processing provides a plurality of semiconductor fins, with the desired fins removed during mid-processing removal of the fins (i.e. removing one or more of the fins during or within the fin forming process).

The resulting structure according to one embodiment is an integrated circuit structure having a first semiconductor fin, a second semiconductor fin neighboring the first fin, and a third semiconductor fin neighboring the second fin. A first trough is defined between the first fin and the second fin, and a second trough defined between the second fin and the third fin. The second trough has a width that is greater than (for example, two to ten times greater than) a width of the first trough between the first fin and the second fin, in accordance with an embodiment of the present disclosure. Geometric dimensions of the first, second, and third semiconductor fins are substantially uniform in accordance with an embodiment of the present disclosure, when taken in cross-section through the substrate and fins, and perpendicular to the fins. Thus, for instance, the trench depth to either side of the fins is largely uniform, as is the fin width taken at a given location on the fins. In addition, there are no intervening fin stubs between the first and second semiconductor fins, or the second and third semiconductor fins, according to some example embodiments. Numerous example configurations and variations will be apparent in light of this disclosure.

General Overview

As noted above, creating integrated circuit structures having semiconductor fins that are very closely spaced and removing certain fins at undesired locations is a challenge. This is particularly true as the distance between fins becomes smaller and the width of the fins becomes smaller, and as aspect ratio increases, making scaling of existing techniques difficult. Removing or trimming one or more fins can be carried out in a number of ways. To assist in understanding fin trim processing according to certain embodiments of the present disclosure, some possible alternative fin trim techniques are described in turn with reference to FIGS. 1A-2D, for comparative purposes. These comparative techniques are generally referred to herein as a fin trim first process and fin trim last process, to facilitate discussion. As will be appreciated in light of this disclosure, each of these possible alternatives can be problematic. For instance, a fin trim first process yields fins having inconsistent fin widths and trench depths (between certain fins), and a fin trim last process leaves fin stubs.

Thus, and in accordance with one or more embodiments of the present disclosure, techniques are provided for removal of semiconductor fins. The removal process is referred to herein as a mid-process or in-situ fin trim process. In an embodiment, the fin forming process is effectively divided into a first etch process and a second etch process. The first etch process stops on a selective etch stop layer and partially forms the fins. At this point, certain partially-formed fins targeted for removal are removed. Then, the second etch process is carried out to finish etching the partially-formed fins to the target fin height. The mid-process fin removal process can be carried out a number of ways. In an embodiment, a sacrificial pattern blocking material is deposited over and in between the plurality of partially-formed fins. One or more sacrificial fin cut mask layers are then deposited on the sacrificial pattern blocking material, and an opening is formed in the one or more sacrificial layers. At least one of the partially-formed fins is removed via the opening in the one or more sacrificial layers. Any remaining sacrificial pattern blocking material is removed, and the fins are then fully formed by the second etch process. As will be appreciated in light of this disclosure, by using a sacrificial fin cut mask layer over the partially-formed fins, the fin trim patterns are transferred to a structural part of the fin using the selective etch stop layer before deep trough etch, which creates uniform dimensions and an intermediate processing to eliminate fin trim stubs. Also, by using a narrow fin mask, the patterning process margin is increased to improve the yield of the process. The final fin dimensions, particular width of the upper fin portion, can be targeted by a liner film deposition after the initial fin trim is completed.

By performing such mid-process, in-situ fin trim, formation of fin stubs on the bottom surface of the trough between the fully formed fins can be avoided. The in-situ fin trim also provides relatively uniform geometric fin dimensions, whether the fins are spaced at the critical dimension or farther apart. Other variations and configurations will be apparent in light of the present disclosure.

Methodology and Architecture—In Situ Fin Trim Processing

FIGS. 3A-3E illustrate example cross-sectional views of integrated circuit structures resulting from a method configured to form a plurality of fins, including a mid-process fin trim to remove one or more partially-formed fins, in accordance with an embodiment of the present disclosure. The cross-section is taken through the substrate and the semiconductor fins, and perpendicular to the fins for each of the FIGS. 3A-3E.

FIG. 3A illustrates an example cross-sectional view of an integrated circuit structure after a hard mask has been etched to provide hard mask features 321', 322', 323', 324', 325', 326', 327', and 328' that are used to pattern the semiconductor fins, in accordance with an embodiment. The hard mask features can be formed by blanket depositing a layer of hard mask material, and selectively etching the hard mask material to provide the hard mask pattern shown. Standard lithography can be used. Other techniques for forming hard mask layers will be appreciated. A substrate 310 has a first etch stop layer 312 formed on the substrate 310, and additional substrate material 314 deposited on the etch stop layer 312. A second etch stop layer 316 is deposited on the substrate material 314. The second etch stop layer 316 is used to provide a stop for etching the hard mask layers 321', 322', 323', 324', 325', 326', 327', and 328', while the first etch stop layer 312 is used to provide a stop for the partial fin forming etch as will be explained in turn.

The substrate 310 can be, for example: a bulk substrate including a group IV material or compound, such as silicon (Si), germanium (Ge), silicon carbide (SiC), or silicon germanium (SiGe); an X on insulator (XOI) structure where X is one of the aforementioned group IV materials and the insulator material is a native oxide material or some other electrically insulating material; or some other suitable multilayer structure where the top layer includes one of the aforementioned group IV materials. In still other embodiments, the substrate 310 may comprise bulk or XOI configurations comprising group III-V compound materials, such as gallium arsenide and indium gallium arsenide. In a more general sense, any suitable substrate 310 can be used, as will be appreciated. In some embodiments, the additional substrate material 314 can include the same semiconductor material as substrate 310, or in other embodiments the additional substrate material 314 is a different material than the substrate 310. As will be appreciated in light of this disclosure, additional substrate material 314 provides a sacrificial layer and can therefore be any number of materials amendable to the processing provided herein.

The etch stop layer 316 can be any etch resistant layer. The etch stop layer 316 selectively resists etching in response to the etchant used when forming the hard mask layers, and such that it does etch away in response to the etchant used to partially-form the fins. A directional etch can be used to remove the exposed portion of etch stop 316 in between hard mask features, prior to the first etch for partially forming the fins. The etch stop layer 312 can be any etch resistant layer. The etch stop layer 312 selectively resists etching in response to the etchant used to partially-form the fins, and such that it does etch away in response to the etchant used to fully form the fins during the second etching (i.e., of the two-etching process). A directional etch can be used to remove the exposed portion of etch stop 312 in between the partially formed fins, prior to the second etch for deep etching the fins to completion. The etch stop layer 312 and etch stop layer 316 can be a same etch stop material, or can be two different etch stop materials, depending on the first and second etch schemes used. Example etch stop materials include boron doped silicon, silicon nitride, silicon oxide, or a metal oxide or a metal nitride.

Figure 3B:
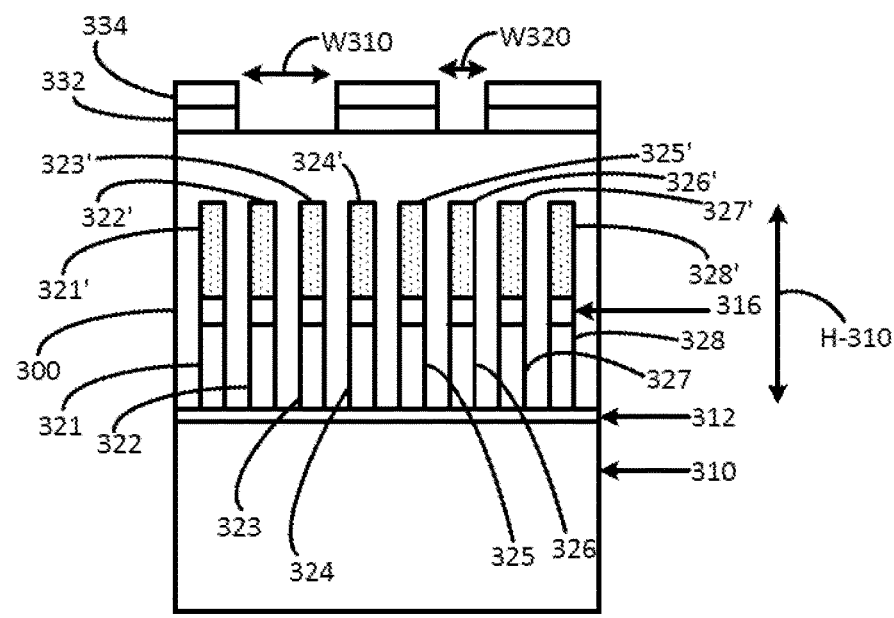

FIG. 3B illustrates an example cross-sectional view of an integrated circuit structure after the fins have been partially formed, and sacrificial pattern blocking material and sacrificial fin cut mask layers have been deposited on the partially-formed fins, in accordance with an embodiment of the present disclosure. The material 314 has been etched down to the first etch stop layer 312 to define partially-formed fins 321, 322, 323, 324, 325, 326, 327, and 328. As will be appreciated in light of this disclosure, these partially-formed fins are sacrificial in nature and will be removed during subsequent processing (e.g., prior to gate stack formation). The selective etch stop layer 312 transfers the fin trim patterns to a structural part of the fins before the deep trough etch. A sacrificial pattern blocking material 300 is then deposited on and in between the partially-formed fins, and can be planarized, as needed, to arrive at the structure of FIG. 3B (prior to deposition and patterning of layers 332 and 334). A first sacrificial fin cut mask layer 332 and a second sacrificial fin cut mask layer 334 are deposited and patterned on the sacrificial pattern blocking material 300. The sacrificial fin cut mask layers 332 and 334 are used to protect the remaining fins so that fins at undesired locations that are targeted for removal can be removed via openings in the sacrificial fin cut mask layers. Note that the first opening has a width W-310 that is sufficient to remove the fins 322 and 323 therethrough, and the second opening has a width W-320 that is sufficient to remove the fin 326 therethrough. Note that the height H-310 associated with the partially-formed fins is significantly less than the height H-210 associated with fully-formed fins, and as such much less etching is required to remove the partially-formed fins. This allows for a better aspect ratio for removing the fins because the opening can be, for example, 30 nm wide or smaller, which provides a better aspect ratio for the relatively short partially-formed fins (as compared to the aspect ratio if the fins were fully formed and therefore taller).

Figure 3C:
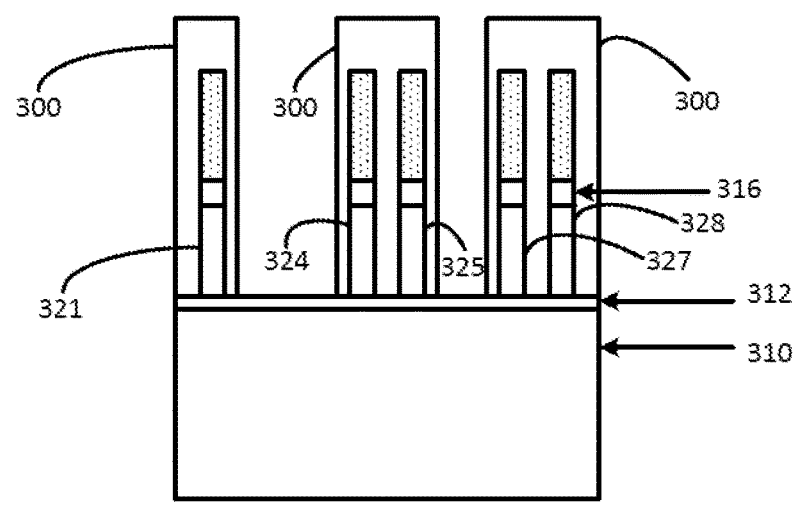

FIG. 3C illustrates an example cross-sectional view of an integrated circuit structure after at least some of the partially-formed fins have been removed, and the sacrificial fin cut mask layers have been removed, in accordance with an embodiment of the present disclosure. For example, the sacrificial fin cut mask layers can be etched away when the partially-formed fins are removed, so that when the targeted partially-formed fins are removed, the sacrificial layers are also etched away and removed. As shown, the partially-formed fins 322, 323, and 326 have been removed via the opening in the sacrificial layers 332 and 334. The sacrificial layers 332 and 334 have also been etched away to arrive at the structure shown in FIG. 3C.

Figure 3D:
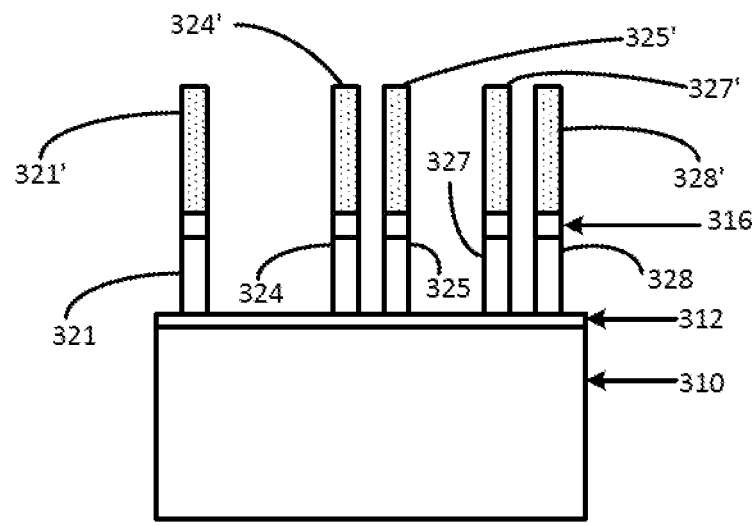
Figure 3D:
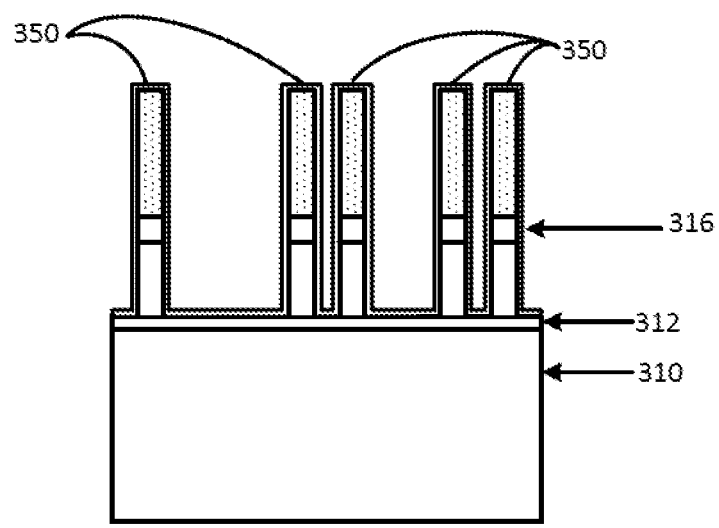

FIG. 3D illustrates an example cross-sectional view of an integrated circuit structure after removal of the sacrificial pattern blocking material, in accordance with an embodiment of the present disclosure. After the in-situ removal of the partially-formed fins, any sacrificial pattern blocking material 300 that remains is removed, thus revealing the remaining partially-formed fins 321, 324, 325, 327, and 328, as shown in FIG. 3D. Each of the fins 321, 324, 325, 327, and 328 has a hard mask layer 321', 324', 325', 327', respectively, and 328' that remains on top and is used to protect the fins during the subsequent etching to reveal fully formed fins. Note that the layer thicknesses are not necessarily drawn to scale. To this end, any suitable layer thicknesses can be used, as will be appreciated. Further note that the fins 321, 324, 325, 327, and 328 are sacrificial in nature, as will be explained in turn.

FIG. 3D' illustrates an example cross-sectional view of an integrated circuit structure after deposition of an optional liner film, in accordance with an embodiment of the present disclosure. The liner film 350 is particularly helpful with high-aspect ratio troughs (e.g., ratio of fin trough height to fin trough width), such as 10:1 or higher (e.g., 20:1 or higher). In this example case, the optional liner film 350 has been deposited over the partially-formed fins and in the troughs formed therebetween. When present, the liner film 350 can be used to control the final width of the fully-formed fins by effectively patterning the fins. The subsequent etch can be directional (anisotropic), so that the liner film 350 on the fields between fins is attacked more aggressively than the liner film 350 on the sides of the fins. The liner film 350 allows the width of the fins to be specified or otherwise targeted to a specific width.

Figure 3E:
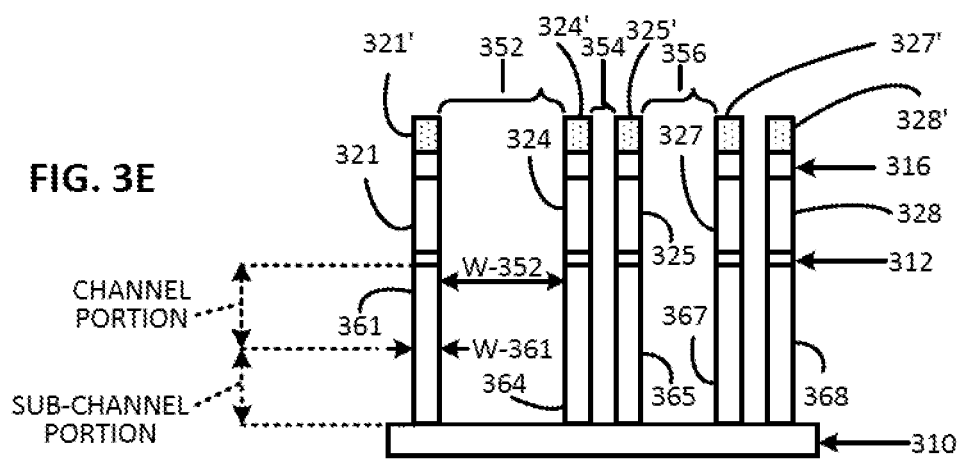

FIG. 3E illustrates an example cross-sectional view of an integrated circuit structure after the plurality of semiconductor fins have been fully formed, in accordance with an embodiment of the present disclosure. The fins can be fully formed by a second etching as previously explained. As shown, the plurality of semiconductor fins 361, 364, 365, 367, and 368, are fully formed such that the fins have a substantially uniform geometric dimension when measured in cross-section taken through the substrate and the fins, and taken perpendicular to the fins (or said differently, when viewed along an axis parallel to the fins). The fins also have a substantially uniform width, as shown. A trough 352 is defined between the fin 361 (and associated layers 312, 321, 316, and 321') and the fin 364 (and associated layers 312, 324, 316, and 324') and a trough 354 is defined between the fin 364 and the fin 365 (and associated layers 312, 325, 316, and 325'). The trough 352 has a first width that is greater than the width of trough 354 defined between the fin 364 and the fin 365. For example, the width of the second trough 354 can be less than 30 nm, and the width of the first trough 352 can be greater than 60 nm or greater than 90 nm or greater than 150 nm. A trough 356 is defined between the fin 365 and the fin 367 having a width that is at least two times greater than the width of trough 354 (e.g., three times greater, or four time greater, etc). The width of a given trough in this example is taken at a point that is about midway between the top and the bottom of the trough (for example the width W-352 of the trough 352) in the channel portion. However, the width can be measured at other locations as well. As shown in FIG. 3E, the bottom surface of the trough 352 has a relatively smooth surface that does not include any semiconductor fins or fin stubs, and the bottom surface of the trough 356 likewise has a smooth surface that does not include any semiconductor fins or fin stubs, which is achieved by the techniques of the present disclosure. Note the bottom surface of the troughs need not be perfectly flat and may have some degree of waviness (e.g., 1 to 4 nm between high and low points of irregular surface height), even though no fin stubs are present. Also, note that the fins 361, 364, 365, 367, and 378 have substantially uniform geometric dimensions, such that widths of the fins taken at a given location will be within a suitable tolerance of each other (e.g., within 1 or 2 nm of each other, or less). Further note that the fins 361, 364, 365, 367, and 378 have a symmetrical taper or profile (one sidewall doesn't slant more or otherwise have a substantially different angle than the other sidewall, within a suitable tolerance such as within 0-5 degrees of one another, as seen in cross-section).

It will be appreciated in light of the present disclosure that "substantially uniform" or "largely uniform" as used herein provides that one measurement is uniform (i.e., the same as) another measurement, within a certain acceptable tolerance. To this end, substantially uniform does not require perfect uniformity in a given dimension. For example, the trench depth, when measured from the bottom of the trench to the top of the neighboring fin, can be approximately 120 nm to 230 nm, according to some embodiments. Note that in some cases the fin top referred to here can be, for example, the top of the fin just under etch stop layer 312, as the etch stop layer 312 itself and the layers above it will be subsequently removed, according to some embodiments. One fin and an adjacent neighboring fin can have a trench located therebetween having a depth that is substantially uniform as compared to neighboring trenches, meaning within a tolerance, such as within 5 nm to 10 nm, or less. Thus, for a depth of 120 nm, a neighboring trench having a depth of 110 nm to 130 nm would be considered "substantially uniform" to the trench having a depth of 120 nm, according to some example embodiments. In still another example embodiment, for a depth of 120 nm, a neighboring trench having a depth of 115 nm to 125 nm would be considered "substantially uniform" to the trench having a depth of 120 nm. In still another example embodiment, for a depth of 120 nm, a neighboring trench having a depth of 118 nm to 122 nm would be considered "substantially uniform" to the trench having a depth of 120 nm. In still another example embodiment, for a depth of 120 nm, a neighboring trench having a depth of 119 nm to 121 nm would be considered "substantially uniform" to the trench having a depth of 120 nm. In still other cases, the trench depth can be considered substantially uniform in accordance with the present disclosure when the depths of neighboring trenches are within 10% of each other, or 5% of each other, or 2% of each other, or 1% of each other. Similarly, the fin width, for example, when viewed along an axis parallel to the fins, is approximately 5 nm to 30 nm, according to some embodiments. Neighboring fins in accordance with the techniques of the present disclosure have a width that is considered substantially uniform when, for example, within a tolerance of 1 nm to 5 nm, or less (e.g., such as widths within 4 nm of some target width, or 3 nm, or 2 nm, or 1 nm, or 0.5 nm). Note that respective widths could be measured at the same height on the fins being compared, such as at the midpoint of the fins. In some cases, the fin width of neighboring fins can be considered substantially uniform when the width of neighboring fins is within 10% of each other, or 5% of each other, or 2% of each other, or 1% of each other. For example, when one fin has a width of approximately 15 nm at its midpoint, a neighboring fin can be considered to have a "substantially uniform" width if the midpoint fin width is in the range of 14 nm to 16 nm, or within 13 nm to 17 nm, or within 12 nm to 18 nm, or within 11 nm to 19 nm, or within 10 nm to 20 nm, depending on the level of acceptable tolerance. Note the tolerances noted herein need not be symmetrical, such as +/-2%; rather, in some embodiments, the tolerance may be asymmetrical, such as +2%/-3%. Numerous reasonable tolerance schemes will be apparent, given the scope and spirit of this disclosure.

The trench width, representative of the width of the trench between two neighboring fins, can be taken, for example, at a height that is approximately midway between a bottom of the trench and a top of the trench. Meaning, the trench width is measured at a position located approximately midway between the top and the bottom, at a centermost position, with some allowable tolerance. For example, approximately midway between the bottom of the trench and the top of the trench may refer to a position that is within 10% or 5% of the exact midpoint between the bottom of the trench and the top of the trench. For example, the height of the trench from just under the etch stop layer 312 to the underlying substrate 310 can be approximately 150 nm in one example case, and accordingly the trench midpoint can be approximately 67.5 nm to 82.5 nm from a bottom of a trench. Thus, the width of that trench can be measured anywhere in that band from 67.5 nm to 82.5 nm. Likewise, a given fin width can be taken, for example, at a height that is approximately midway between a bottom of the neighboring trench and a top of the fin. As previously noted, the final fin structure will generally not include the etch stop layer 312 or any layers above it. So these dimensional measurements (fin width, trench depth, trench width, etc) can be made with that in mind. As will be appreciated, these non-limiting examples of height and width for the fins and trenches therebetween are not intended to limit the scope of the disclosure, but rather provide example ranges and tolerances.

Once the semiconductor fins 361, 364, 365, 367, and 368, are fully formed, note that the resulting structure shown in FIG. 3E can be planarized. In one such case, the planarization is carried out by deposition of an insulator fill material in between and over the fins and a subsequent chemical-mechanical planarization (CMP) process. In some embodiments, the planarization process may remove all features above the etch stop 312, while in other embodiments, the planarization process may further remove the etch stop 312. The resulting heights of the semiconductor fins 361, 364, 365, 367, and 368, including the channel portion and the sub-channel portion, after the planarization process may be in the range of, for example, 100 nm to 250 nm, according to some embodiments. In a more general sense, the height of the semiconductor fins 361, 364, 365, 367, and 368 can be set to any desired height, and the present disclosure is not intended to be limited to any particular range of fin heights. The finally formed fins can then be used in a standard or custom transistor forming process, such as a metal oxide semiconductor (MOS) transistor process.

Thus, the integrated circuit structure of FIG. 3E includes a first semiconductor fin, a second semiconductor fin, and a third semiconductor fin of a plurality of semiconductor fins. The second semiconductor fin is neighboring the first semiconductor fin with no intervening fins or fin stubs therebetween, and the third semiconductor fin is neighboring one of the first or second semiconductor fins with no intervening fins or fin stubs therebetween. A second trough having a second width is defined between the first or second fins and the third fin, such that the second width is at least two times greater than a first width of the first trough between the first and second fins, or at least three times greater than the first width, or at least four times greater than the first width, or at least five times greater than the first width, or at least six times greater than the first width, or at least seven times greater than the first width, or at least eight times greater than the first width, or at least nine times greater than the first width, or at least ten times greater than the first width, etc. The geometric dimensions of the first, second, and third semiconductor fins are substantially uniform (within acceptable tolerances as previously explained), when viewed along an axis parallel to the fins (as measured in cross-section taken through the substrate and fins and perpendicular to the fins).

In any such cases, note that a larger overall set of fins that includes the first, second, and third fins can be formed in a single process as provided herein, the set including any number of fins such as 10, 25, 50, 100, 500, 1000, 5000, 10000, or 50000 fins (or more), wherein that entire set of fins formed by the single process as variously provided herein includes no fin stubs between any of its fins, according to some embodiments of the present disclosure. In some embodiments, an entire integrated circuit formed using the techniques provided herein is fin stub free. In still other embodiments, an entire section of a given integrated circuit formed using the techniques provided herein is fin stub free, such as a fin stub free logic section or a fin stub free input/output (I/O) section of an integrated circuit. In still other embodiments, a given integrated circuit may include multiple types of fins, such as relatively thin fins used in a logic section and relatively thick fins used in an I/O section, and any one or more of these fin types can be formed with a fin stub free process as provided herein.

As will be appreciated, a fin stub as used herein refers to a fin that has been partially removed and not subjected to a fin replacement process (hence, only a fin stub is left, and the upper portion of the fin is not present). To this end, a fin stub is not to be confused with any portion of a fin that has been formed with multiple layers or subjected to an etch and replace process, such as a fin having epitaxial source/drain regions deposited onto a recessed portion of the fin, or a fin having replacement channel material deposited onto a recessed portion of the fin. Such replacement fin structures, including the recessed original fin and the epitaxially deposited replacement materials, are not fin stubs as used herein.

In accordance with an embodiment of the present disclosure, some of the fins are formed into transistor structures, such that the fin includes an upper channel portion and a sub-channel portion below the upper channel portion, as generally shown in FIG. 3E (note that etch stop 312 and layers above have not been removed yet). As will be appreciated, the channel portion is effectively defined by where the gate structure is located on the fin (the channel portion is generally the portion of the fin that is covered by the gate structure). In one such embodiment, each sub-channel portion has a width (W-361, for example) that is within 1.5 nm of a target width, as measured in cross-section taken through the substrate and fins and perpendicular to the fins, and at a level corresponding to about mid-way point of at least one of the sub-channel portions. In some embodiments, the width of each sub-channel portion can be within 1.0 nm or 0.5 nm of the target width. The first trough has a first depth and the second trough has a second depth, and in some embodiments the first depth is within 5 nm of the second depth, as measured in the cross-section taken through the substrate and the fins and perpendicular to the fins. In some embodiments, the first depth is within 3 nm of the second depth (e.g., such as within 0.1 nm to 2 nm).

It will be appreciated that these figures are not to scale, nor are they necessarily proportional, but are shown for illustrative and descriptive purposes only. For example, the substrate 310 is shown in FIG. 3E as being substantially shorter than the semiconductor fins, however the substrate may be much taller than the fins (e.g., has a height that is 10 or 100 times taller than the height of the fins).

It will be appreciated that the order of FIGS. 3A-3E is only one example sequential process for forming the structure of FIG. 3E, and the process can be varied in accordance with the example embodiments disclosed herein. Also, additional front-end processing can occur, for example forming a transistor device on one or more of the fins. The transistor may be formed using a gate last process or a gate first process, and/or fin replacement techniques. The source/drain regions of the transistor may be formed in the fin itself by implantation doping, or by an etch and replace scheme to provide epitaxial source/drain regions on the given fin. Contacts and interconnect structure can then be provided to make electrical contact with the transistor, to form a desired circuit. Numerous device configurations can be implemented using fins as formed herein.

Methodology—Mid-Processing (In-Situ) Fin Trim

Figure 4:
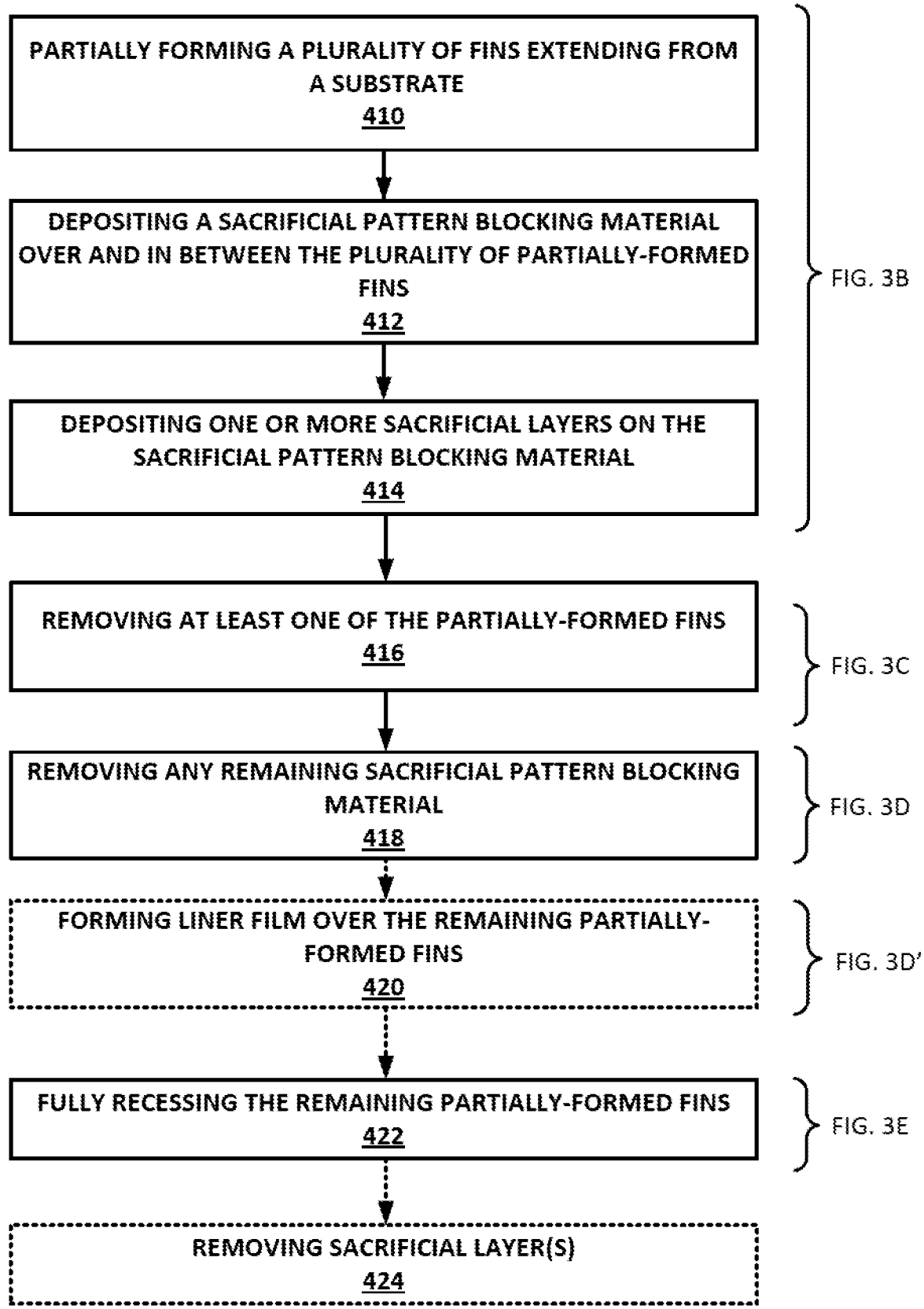
FIG. 4 illustrates a methodology for forming a plurality of fins, in accordance with an embodiment of the present disclosure.

FIG. 4 illustrates a methodology for forming a plurality of fins, in accordance with an embodiment of the present disclosure. As can be seen, at 410, the methodology includes partially forming a plurality of fins extending from a substrate. As will be appreciated, the fins may comprise multiple layers and materials to facilitate the fin forming and trim process provided herein. This partial fin formation can be carried out, for example, by performing a first etching of the layers of the substrate down to a first etch stop layer. Refer, for example, to FIG. 3B illustrating an example cross-sectional view of an integrated circuit structure including a plurality of partially-formed fins 321, 322, 323, 324, 325, 326, 327, and 328 extending from a substrate 310. At 412, sacrificial pattern blocking material is deposited over and in between the plurality of partially-formed fins. Refer, for example, to FIG. 3B illustrating sacrificial pattern blocking material 300 deposited over and in between the partially-formed fins 321, 322, 323, 324, 325, 326, 327, and 328. At 414, one or more sacrificial layers are deposited on the sacrificial pattern blocking material. Refer, for example, to FIG. 3B illustrating two sacrificial layers 332, 334 deposited on the sacrificial pattern blocking material 300, with two openings in the sacrificial layers.

At 416, at least one of the partially-formed fins is removed. This removal can be carried out, for example, by etching of the sacrificial fin cut mask layers and the target partially-formed fins via the opening. Refer, for example, to FIG. 3C illustrating an example integrated circuit structure after the fins 322, 323, and 326 have been removed, thus leaving partially-formed fins 321, 324, 325, 327, and 328 extending from the substrate and covered in sacrificial pattern blocking material 300.

At 418, any remaining sacrificial pattern blocking material is removed. The remaining sacrificial pattern blocking material can be removed, for example, by selective etching, or other techniques, as will be appreciated. Refer, for example, to FIG. 3D illustrating an example integrated circuit structure after partially-formed fins 322, 323, and 326 have been removed. Note that the remaining sacrificial pattern blocking material (for example, sacrificial pattern blocking material 300 in FIG. 3C) has also been removed. The partially-formed fins 321, 324, 325, 327, and 328 are shown extending from the substrate 310.

At 420, a liner film can optionally be formed over the remaining partially-formed fins. Refer, for example, to FIG. 3D' for an example integrated circuit structure having a liner film 350 deposited on a plurality of partially-formed fins. The liner film deposition after the forming of the partial fins is completed allows the final fin dimension to be targeted. In other embodiments, no liner is used. Note that the liner film 350 deposition can be selective, such that liner film 350 is only deposited on the fin structure and not the etchstop 312 (the field area between fins). In other cases, the liner film 350 is also deposited on the field between the fins, but is etched off at 422 via a directional (vertical) etch that attacks the horizontal portions of the liner film 350 in the field area more aggressively than the vertical portions of the liner film 350 on the sidewalls of the fin structure.

At 422, the remaining partially-recessed fins are fully formed, which can be performed by a second etching process. Note that the etch selectivity can be tuned as needed, depending on the materials exposed to the etch. Refer, for example, to FIG. 3E for an example integrated circuit structure including a plurality of fully-formed semiconductor fins. It will be appreciated in light of the present disclosure that the hard mask (e.g., 321', 324', 325', 327', and 328') and other layers (e.g., 316) at the top of the semiconductor fins may be removed (at 424) to reveal the underlying fins (for example, fins 361, 364, 365, 367, and 368 in FIG. 3E). For example, these layers may be removed to access the fins, to perform further processing or additional fabrication, as will be appreciated.

Note that reference herein to structural features such as a top and a bottom may generally refer to top or bottom surfaces that undulate within a tolerance (e.g., such as a surface that has a distance between its highest and lowest points of 2 nm or less, but is not perfectly flat). To this end, such reference to top or bottom of a given structure is not intended to be limited to a true top or bottom that is some specific point along a top or bottom surface of the structure, but instead refers to an overall or macro top or bottom surface, as will be appreciated. In addition, a sidewall as used herein generally refers to a downward trending surface that is lower than or otherwise a suitable distance from a lowest point of a top surface. Similarly, a sidewall as used herein may also generally refer to an upward trending surface that is higher than or otherwise a suitable distance from a highest point of a bottom surface. So, for instance, if the top surface of a given structure is a point, then the sidewall of that structure is the downward trending surface extending downward from that point, or more specifically, the downward trending surface that is 1 nm or more lower than that point, for example. Likewise, if the top surface of a given structure is a flat but undulating surface, then the sidewall of that structure is the downward trending surface extending downward from that undulating surface, or more specifically, the downward trending surface that is 1 nm or more lower than the lowest point of that undulating surface, for example.

Further note that reference herein to structural features such as width and height may generally refer to dimensions that vary in value, depending on where they are measured on the given structure. For instance, if a top surface of a structure undulates between high and low points rather than being perfectly flat, the height of that structure may vary depending on where it is measure. Similarly, if a fin-like structure extending upward is tapered, the width decreases from the base to the top of the fin. In any such cases, a width or height can be measured, for example, as an average value of multiple width or height measurements for a given surface, or a median value of multiple width or height measurements for a given surface, or some other statistically relevant representation of the height or width or other dimension of interest. In some cases, a width of a structure can be measured as an intermediate or midway point between the macro top and bottom surfaces of that structure. Likewise, a height of a structure can be measured as an intermediate or midway point between the sidewalls of that structure.

Any number of additional processes may be performed to complete the formation of one or more transistor devices, such as forming a gate stack (dummy and final gate stacks, depending on process used), source/drain regions, source/drain contacts, and performing back-end-of line interconnections (e.g., metal layers M1 through M9), for example. A standard or custom MOS transistor formation process flow may be used.

Numerous benefits will be apparent in light of this disclosure. For example, in some embodiments, the techniques reduce or eliminate leakage or performance reduction due to fin stubs that may form as a result of fin trim last fabrication, or fin width mismatch and/or height mismatch that may result from fin trim first fabrication. A narrower hard mask can also be used, thereby increasing the patterning process margin. By using a sacrificial fin cut mask layer over the fins, the fin trim patterns are transferred to the structural part of the fin using a selective etch stop layer before deep trough etch, which creates uniform fin geometry dimensions and an intermediate processing to eliminate fin trim stubs. Thus, power leakage and overall performance is improved, according to some embodiments.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging or tomography, local electrode atom probe (LEAP) techniques, 3D tomography, high resolution physical or chemical analysis, to name a few suitable example analytical tools. In particular, in some embodiments, such tools may indicate a structure or device configured with a trough between a first fin and a second fin that has a width that is at least two times greater (or otherwise many times greater, such as at least 4 or 5 times greater) than a trough between a second fin and a third fin. Such a structure would have a relatively smooth bottom surface of the wider trough, without any intervening fin stubs on the bottom surface of the wider trough, while still providing fins having relatively uniform geometric dimensions. Numerous detectable structural configurations and variations will be apparent in light of this disclosure.

Architecture—Comparative Examples

Figure 5A:
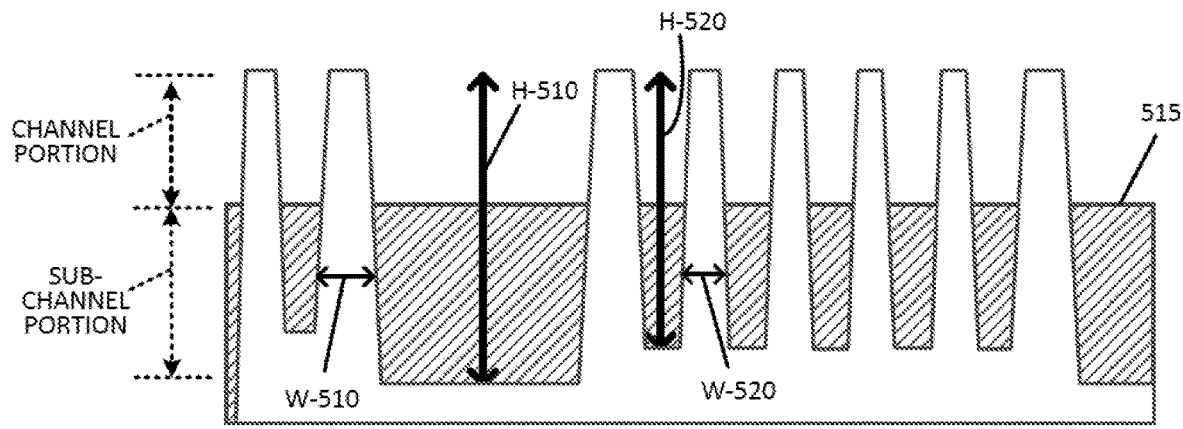
FIG. 5A illustrates an example cross-sectional view of an integrated circuit structure including a plurality of semiconductor fins, formed using a fin trim first process. The cross-section is taken through the substrate and the semiconductor fins, and perpendicular to the fins.
Figure 5B:
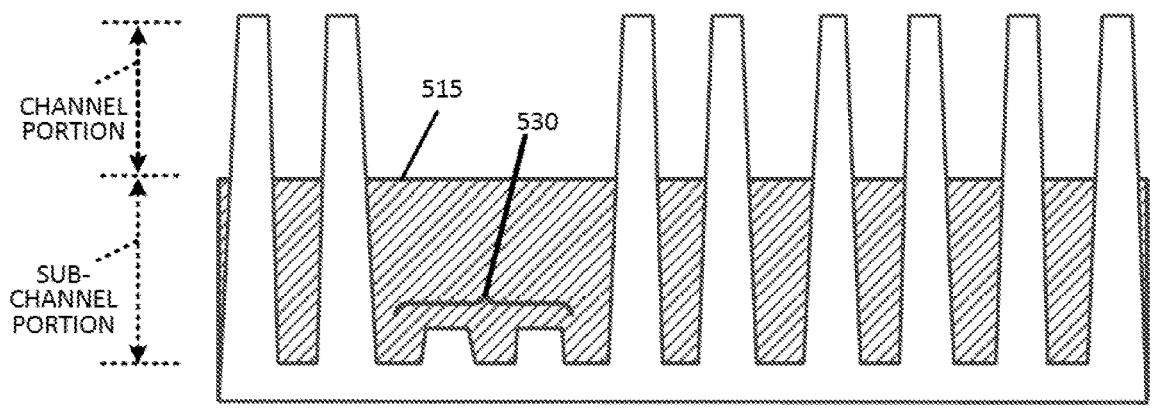
FIG. 5B illustrates an example cross-sectional view of an integrated circuit structure including a plurality of semiconductor fins, formed using a fin trim last process. The cross-section is taken through the substrate and the semiconductor fins, and perpendicular to the fins.
Figure 5C:
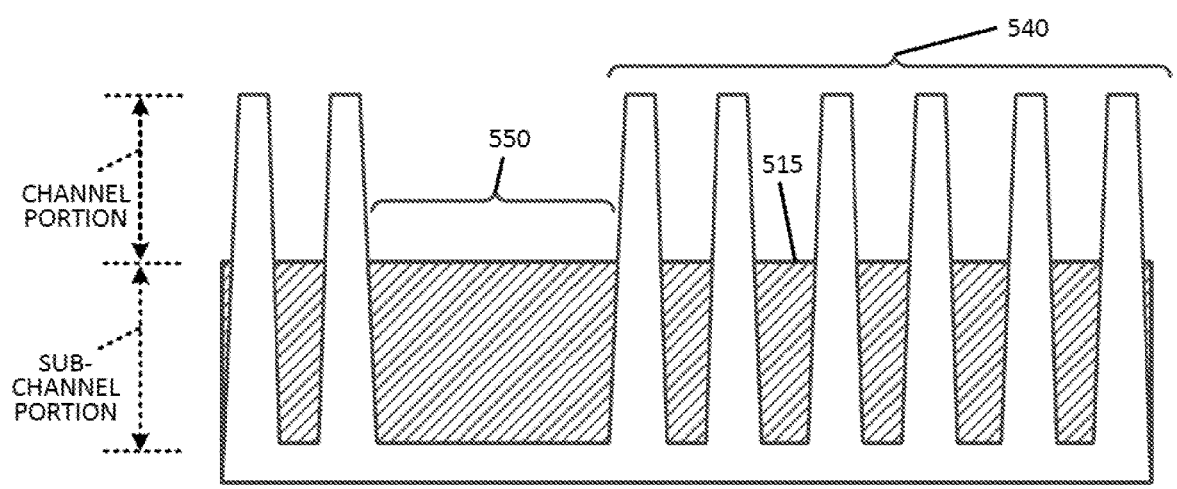
FIG. 5C illustrates an example cross-sectional view of an integrated circuit structure including a plurality of semiconductor fins, formed using a mid-process fin trim methodology in accordance with an embodiment of the present disclosure. The cross-section is taken through the substrate and the semiconductor fins, and perpendicular to the fins.

FIG. 5A illustrates an example cross-sectional view of an integrated circuit structure formed via a fin trim first process, FIG. 5B illustrates an example cross-sectional view of an integrated circuit structure formed via a fin trim last process, and FIG. 5C illustrates an example cross-sectional view of an integrated circuit structure formed via an in-situ fin trim process in accordance with an embodiment of the present disclosure. These cross-sectional views are taken through the substrate and the semiconductor fins, and perpendicular to the fins. The cross-sectional view is taken after the fins have been formed and a shallow trench isolation (STI) material 515 has been deposited and etched down partially to define the channel portion and the sub-channel portion of the integrated circuit structure. Example comparative process flows are also provided, for purposes of robust disclosure.

FIG. 5A illustrates an example cross-sectional view of an integrated circuit structure including a plurality of semiconductor fins formed using a fin trim first process. As shown, the fin trim first processing results in a mismatch in the width of the fins and also in the height of the trough between the fins. For example, the width W-510 in the sub-channel region of a first fin is substantially different from the width W-520 in the sub-channel region of a second fin (e.g., 3 to 5 nm different, or more), and the height H-510 of a first trough is substantially different from the height H-520 of a second trough (e.g., 4 to 10 nm different, or more). Also, note that the end fins near areas where fins were removed (or not formed, as the case may be) have an asymmetrical taper, such that the side of the fin adjacent the deeper trench side has a less steep slope than the other side of the fin. FIGS. 1A-1E illustrate a fin trim first process that further explains the inconsistent fin widths and trough depths, and will be discussed in turn.

FIG. 5B illustrates an example cross-sectional view of an integrated circuit structure including a plurality of semiconductor fins formed using a fin trim last process. As shown, the fin trim last processing results in fin stubs 530 in the trough between the fins. FIGS. 2A-2D illustrate a fin trim last process that further explains the fin stub formation problem, and will be discussed in turn.

FIG. 5C illustrates an example cross-sectional view of an integrated circuit structure including a plurality of semiconductor fins formed in accordance with an embodiment of the present disclosure. As shown, the in-situ fin trim processing scheme, by performing intermediate or mid-processing removal of target fins, ultimately provides fins having relatively uniform geometric dimensions across the plurality of fins as generally shown in area 540, while also preventing the formation of any stubs in the trough 550 where one or more fins have been removed, thereby providing a relatively smooth bottom surface of the trough 550. It will be appreciated that these are only example cross-sectional views and other embodiments may have a different fin configuration. For instance, the embodiment shown in FIG. 5C includes a single fin pitch (not counting the removed fins), but other embodiments may have different spacing. In one such alternative case, the integrated circuit may include fin pairs, with a first spacing between fins of a given pair, a second spacing between neighboring fin pairs, and a third spacing between neighboring fin pairs where intervening fin pairs have been removed. It will be appreciated that fin spacing is in part a function of the fin patterning method used, where fins or groups of fins are provided at a certain pitch. Numerous other fin configurations, variations and modifications will be apparent.

Comparative Process Flow #1: Fin Trim First

A fin trim first process is where undesired fins are essentially masked out prior to the fin etch process, thereby preventing formation of fins in certain locations (in this sense, the fins are not really trimmed—they are simply not formed). An example such process is shown in in FIGS. 1A-1E. As can be seen in FIG. 1A, a substrate 110 has an etch stop layer 108 formed thereon and a hard mask 105 formed over the etch stop layer 108. A backbone-spacer arrangement is patterned onto the hard mask 105, thereby providing backbone 121, 123, 125, as well as spacers 111, 112, 113, 114, 115, and 116. A sacrificial pattern blocking material 130 is deposited on the spacers and backbone, and can be a carbon hard mask or another etch resist material such as a fluorous oxide. As shown in FIG. 1B, the spacers 114 and 115 are removed, for example, via appropriate etching (e.g., an etchant that is selective to the backbone and sacrificial pattern blocking materials, such that only the exposed spacer material is removed). The insulation material 130 is then removed to arrive at the structure of FIG. 1C. As shown in FIG. 1C, the remaining spacers 111, 112, 113 and 116 are shown at the desired location of fins. An etching is then performed into the hard mask 105 as patterned by the spacers 111, 112, 113, and 116, to form the patterned hard mask features 141, 142, 143, and 146. The etch stop layer 108 serves as a stop to the etch. With reference to FIG. 1E, an etch is performed to etch through the etch stop layer 108 and into the substrate 110, thereby forming fins 151, 152, 153, and 156. However, due to the large gap that exists between the hard mask 143 and hard mask 146, there is an uneven etching that occurs in the trough between the fins 153 and 156. In particular, and as further shown in FIG. 1E, there is a mismatch in the width of the fins 151, 152 that are spaced closely together as compared to the isolated fins 153 and 156. Furthermore, note the asymmetrical taper of fins 153 and 156. Moreover, because the etchant etches the trough between the closer fins 151, 152, and 153 more quickly than the trough between the fins 153 and 156, the depth of the trough between fins 153 and 156 is less than the depth of the trough between the nested fins 151, 152, and 153. The mismatch in width of fins and trough depth can have negative implications on performance, including increased power leakage.

Comparative Process Flow #2: Fin Trim Last

A fin trim last technique is where fins at undesired positions are removed after they have been fully formed. An example such process is shown in in FIGS. 2A-2D. As shown in FIG. 2A, a substrate 210 has an etch stop layer 208 deposited thereon and a patterned hard mask, including features 211, 212, 213, 214, 215, 216, 217, and 218, formed on the etch stop layer 108. Note that hard mask is patterned such that there is an even spacing or pitch between the fins, as compared to the irregular spacing of FIG. 1D. As shown in FIG. 2B, the hard mask features are used to form a plurality of semiconductor fins 221, 222, 223, 224, 225, 226, 227, and 228. A sacrificial pattern blocking material 240 is then deposited on the fins. A first sacrificial fin cut mask layer 232 and a second sacrificial fin cut mask layer 230 are deposited and patterned on the sacrificial pattern blocking material 240. A first opening having a width W-210, and a second opening having a width W-220, are formed in the sacrificial fin cut mask layers. The openings through the sacrificial layers are used to remove the fins at certain locations. Due to the overall height H-210 of the fully formed fins, it is difficult to etch completely down to the bottom of the fin trough through the opening in the sacrificial layers. As shown in FIG. 2C, this results in fin stubs 262, 263, and 266 remaining on the substrate 210. FIG. 2D shows the structure after the sacrificial pattern blocking material 240 has been removed. The fin stubs 262, 263, and 266 can increase leakage power or reduce performance of the integrated circuit. The fin trim last processing also requires a relatively large amount of hard mask material to be used because the hard mask must be able to withstand all of the processing during the relatively deep etch fin removal.

Example System

Figure 6:
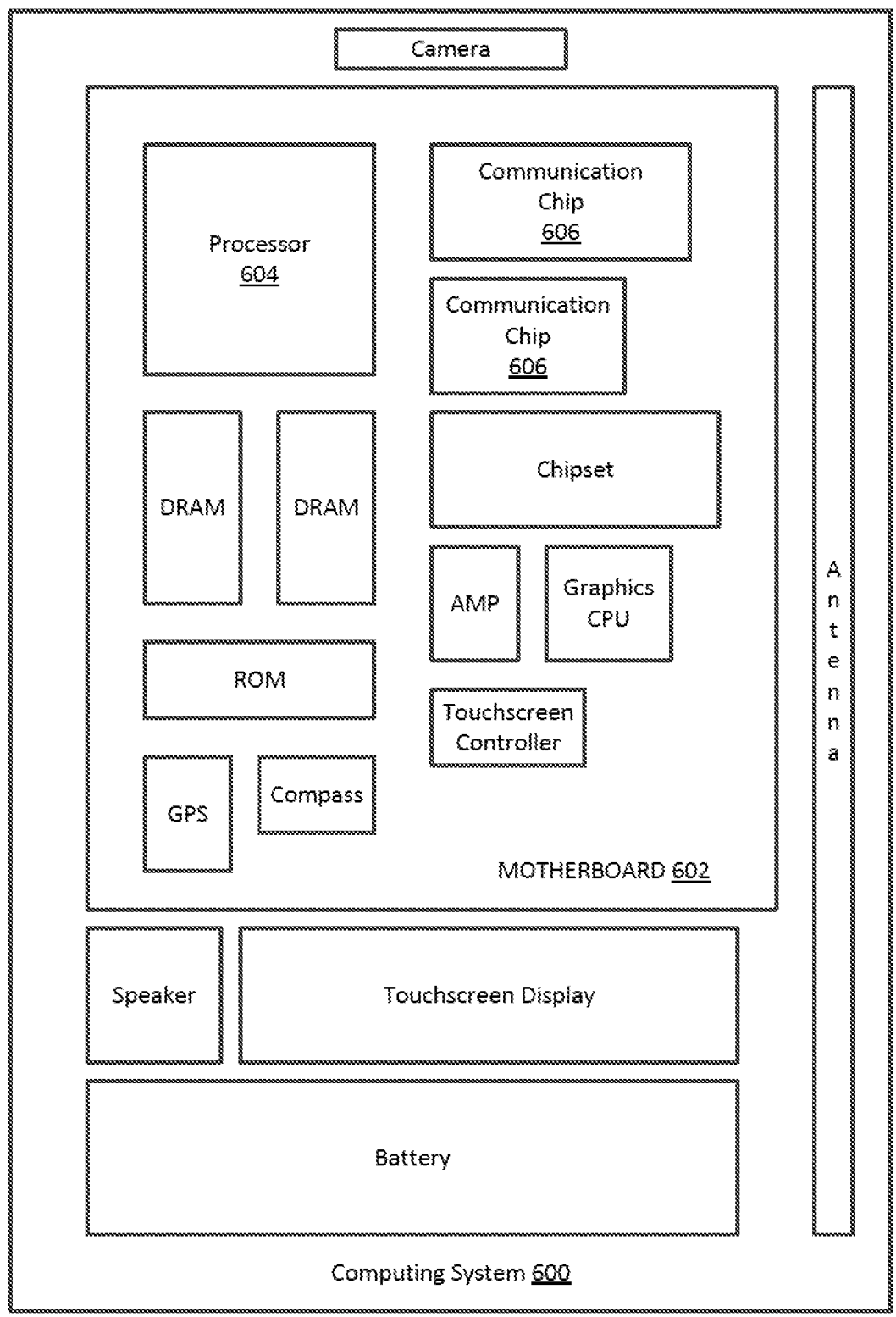
FIG. 6 illustrates a computing system implemented with integrated circuit structures or devices formed using the techniques disclosed herein, in accordance with some embodiments of this disclosure.

FIG. 6 illustrates a computing system 600 implemented with one or more integrated circuit structures or devices formed using the techniques disclosed herein, in accordance with some embodiments of this disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board, whether a main board, a daughterboard mounted on a main board, or the only board of system 600, etc.

Depending on its applications, computing system 1200 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured with fins formed as variously provided herein, in accordance with an example embodiment. In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more integrated circuit structures or devices configured with fins formed as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more integrated circuit structures or devices configured with fins formed as variously described herein. As will be appreciated in light of this disclosure, note that multi-standard wireless capability may be integrated directly into the processor 604 (e.g., where functionality of any chips 1206 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing device 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices configured with fins formed as variously described herein.

Further Example Embodiments

The following examples pertain to further embodiments, from which numerous permutations and configurations will be apparent.

Example 1 includes an integrated circuit comprising: a first semiconductor fin of a plurality of semiconductor fins; a second semiconductor fin of the plurality of semiconductor fins, the second semiconductor fin neighboring the first semiconductor fin with no intervening fins or fin stubs therebetween, wherein a first trough having a first width is located between the first semiconductor fin and the second semiconductor fin, when viewed along an axis parallel to the fins, and the first width is taken at a height that is approximately midway between a bottom and a top of the first trough; and a third semiconductor fin of the plurality of semiconductor fins, the third semiconductor fin neighboring one of the first semiconductor fin or the second semiconductor fin with no intervening fins or fin stubs therebetween, wherein a second trough having a second width is located between the first or second semiconductor fin and the third semiconductor fin, such that the second width of the second trough is more than two times greater than the first width of the first trough, when viewed along an axis parallel to the fins, and the second width is taken at a height that is approximately midway between a bottom and a top of the second trough; wherein a first depth being the distance between the top and bottom of the first trough is within 5 nm of a second depth being the distance between the top and bottom of the second trough.

Example 2 includes the subject matter of Example 1, wherein at least one of the first, second, and third semiconductor fins includes a sub-channel portion below an upper channel portion, each sub-channel portion having a width that is within 2 nm of a target width, when viewed along an axis parallel to the fins, and at a level corresponding to a mid-way point of at least one of the sub-channel portions.

Example 3 includes the subject matter of Example 1 or 2, wherein the width of each sub-channel portion is within 1 nm of the desired width.

Example 4 includes the subject matter of any of the preceding Examples, wherein the first depth is within 3 nm of the second depth.

Example 5 includes the subject matter of any of the preceding Examples, wherein the first depth is within 1 nm of the second depth.

Example 6 includes the subject matter of any of the preceding Examples, and further includes a substrate, wherein at least some of the plurality of semiconductor fins are not native to the substrate and are compositionally different from the substrate.

Example 7 includes the subject matter of any of the preceding Examples, wherein the plurality of semiconductor fins comprise a group IV semiconductor material, a group III-V semiconductor material, or a combination of group IV and group III-V semiconductor materials.

Example 8 includes the subject matter of any of the preceding Examples, wherein the plurality of semiconductor fins comprise at least one of silicon and germanium.

Example 9 includes the subject matter of any of the preceding Examples, wherein the first width of the first trough is less than 50 nm and the second width of the second trough is greater than 100 nm.

Example 10 includes the subject matter of any of the preceding Examples, wherein the second width of the second trough is more than three times greater than the first width of the first trough.

Example 11 includes the subject matter of any of the preceding Examples, wherein the second width of the second trough is more than four times greater than the first width of the first trough.

Example 12 includes the subject matter of any of the preceding Examples, wherein the second width of the second trough is more than five times greater than the first width of the first trough.

Example 13 includes the subject matter of any of the preceding Examples, wherein the second width of the second trough is over six times greater than the first width of the first trough.

Example 14 includes the subject matter of any of the preceding Examples, wherein the first, second, and third semiconductor fins each has a height of 50 nm or more.

Example 15 includes the subject matter of any of the preceding Examples, wherein each of the first, second, and third semiconductor fins has a width that is within 2 nm of a target width, when viewed along an axis parallel to the fins, and at a level corresponding to a mid-way point of at least one of the first, second, and third semiconductor fins. In some such Examples, each of the first, second, and third semiconductor fins has a width that is within 1.5 nm of a target width. In still further such Examples, each of the first, second, and third semiconductor fins has a width that is within 1.0 nm of a target width. In still further such Examples, each of the first, second, and third semiconductor fins has a width that is within 0.5 nm of a target width. In still further such Examples, each of the first, second, and third semiconductor fins has a width that is within 0.2 nm of a target width.

Example 16 includes the subject matter of Example 15, wherein the target width is in the range of 4 nm to 30 nm.

Example 17 includes the subject matter of Example 15, wherein the target width is in the range of 4 nm to 25 nm.

Example 18 includes the subject matter of Example 15, wherein the target width is in the range of 4 nm to 20 nm.

Example 19 includes the subject matter of Example 15, wherein the target width is in the range of 4 nm to 15 nm.

Example 20 includes the subject matter of Example 15, wherein the target width is in the range of 4 nm to 12 nm.

Example 21 includes the subject matter of Example 15, wherein the target width is in the range of 4 nm to 10 nm.

Example 22 includes the subject matter of Example 15, wherein the target width is in the range of 4 nm to 8 nm.

Example 23 is an integrated circuit comprising: a first semiconductor fin of a plurality of semiconductor fins; a second semiconductor fin of the plurality of semiconductor fins, the second semiconductor fin neighboring the first semiconductor fin with no intervening fins or fin stubs therebetween, wherein a first trough having a first width is located between the first semiconductor fin and the second semiconductor fin, when viewed along an axis parallel to the fins, and the first width is taken at a height that is approximately midway between a bottom and a top of the first trough; and a third semiconductor fin of the plurality of semiconductor fins, the third semiconductor fin neighboring one of the first semiconductor fin or the second semiconductor fin with no intervening fins or fin stubs therebetween, wherein a second trough having a second width is located between the first or second semiconductor fin and the third semiconductor fin, such that the second width of the second trough is more than three times greater than the first width of the first trough, when viewed along an axis parallel to the fins, and the second width is taken at a height that is approximately midway between a bottom and a top of the second trough; wherein each of the first, second, and third semiconductor fins has a height of 50 nm or more; wherein each of the first, second, and third semiconductor fins has a width that is within 2 nm of a target width, when viewed along an axis parallel to the fins, and at a level corresponding to a mid-way point of at least one of the first, second, and third semiconductor fins; and wherein a first depth being the distance between the top and bottom of the first trough is within 5 nm of a second depth being the distance between the top and bottom of the second trough. The previous alternative examples provided in Example 15 equally apply here.

Example 24 includes the subject matter of Example 23, wherein the first depth is within 3 nm of the second depth.

Example 25 includes the subject matter of Example 23 or 24, wherein the first depth is within 1 nm of the second depth.

Example 26 includes the subject matter of any of Examples 23 through 25, wherein the first width of the first trough is less than 50 nm and the second width of the second trough is greater than 100 nm.

Example 27 includes the subject matter of any of Examples 23 through 26, wherein the second width of the second trough is more than four times greater than the first width of the first trough.

Example 28 includes the subject matter of any of Examples 23 through 27, wherein the second width of the second trough is more than five times greater than the first width of the first trough.

Example 29 includes the subject matter of any of Examples 23 through 28, wherein the second width of the second trough is over six times greater than the first width of the first trough.

Example 30 includes the subject matter of any of Examples 23 through 29, wherein each of the first, second, and third semiconductor fins has a height of 75 nm or more.

Example 31 includes the subject matter of any of Examples 23 through 30, wherein each of the first, second, and third semiconductor fins has a height of 100 nm or more.

Example 32 includes the subject matter of any of Examples 23 through 31, wherein the target width is in the range of 4 nm to 30 nm.

Example 33 includes the subject matter of any of Examples 23 through 32, wherein the target width is in the range of 4 nm to 25 nm.

Example 34 includes the subject matter of any of Examples 23 through 33, wherein the target width is in the range of 4 nm to 20 nm.

Example 35 includes the subject matter of any of Examples 23 through 34, wherein the target width is in the range of 4 nm to 15 nm.

Example 36 includes the subject matter of any of Examples 23 through 35, wherein the target width is in the range of 4 nm to 12 nm.

Example 37 includes the subject matter of any of Examples 23 through 36, wherein the target width is in the range of 4 nm to 10 nm.

Example 38 includes the subject matter of any of Examples 23 through 37, wherein the target width is in the range of 4 nm to 8 nm.

Example 39 is a method of forming an integrated circuit, the method comprising: partially forming a plurality of semiconductor fins in a sacrificial semiconductor layer; depositing a sacrificial pattern blocking material over and in between the plurality of semiconductor fins and over the substrate; depositing and patterning at least one sacrificial fin cut mask layer on the sacrificial pattern blocking material; removing at least one fin of the plurality of semiconductor fins via at least one opening in the at least one sacrificial fin cut mask layer; removing the sacrificial pattern blocking material; and fully forming the plurality of semiconductor fins that remain after removing the at least one fin, by etching into a second semiconductor layer below the sacrificial semiconductor layer.

Example 40 includes the subject matter of Example 39, and further includes depositing a liner film on the partially-formed fins prior to fully forming the plurality of semiconductor fins.

Example 41 includes the subject matter of Example 39 or 40, wherein removing the at least one fin of the plurality of semiconductor fins is performed by etching the at least one of the plurality of semiconductor fins via the at least one opening in the at least one sacrificial fin cut mask layer, such that there is no fin stub remaining after the removing.

Example 42 includes the subject matter of any of Examples 39 through 41, wherein after partially forming the plurality of semiconductor fins, the semiconductor fins have a height less than 30 nm.

Example 43 includes the subject matter of any of Examples 39 through 42, wherein after fully forming the plurality of semiconductor fins, the semiconductor fins have a height greater than 50 nm. In some such examples, the fin height noted here does not include the partially formed fin portion, which is removed in some cases.

Example 44 includes the subject matter of any of Examples 39 through 43, wherein partially forming the plurality of semiconductor fins is performed by a first etching using a material comprising at least one of: chlorine, fluorine, and bromine.

Example 45 includes the subject matter of any of Examples 39 through 44, wherein fully forming the plurality of semiconductor fins comprises performing a second etching of the plurality of semiconductor fins, and wherein the second etching is performed using a material comprising at least one of: chlorine, fluorine, and bromine.

Example 46 includes the subject matter of any of Examples 39 through 45, wherein the second etching is a different etching than a first etching used to form partially form the plurality of semiconductor fins.

Example 47 includes the subject matter of any of Examples 39 through 46, wherein the at least one sacrificial fin cut mask layer is provisioned by lithography.

Example 48 includes the subject matter of any of Examples 39 through 47, and further includes removing an upper portion of the fully formed fins, the upper portion including the sacrificial semiconductor layer.

Example 49 includes the subject matter of Example 48, wherein there is an etch stop layer between the sacrificial semiconductor layer and the second semiconductor layer, and removing the upper portion of the fully formed fins including removing the etch stop layer.

Example 50 includes the subject matter of any of Examples 39 through 49, wherein the sacrificial semiconductor layer is polysilicon and the second semiconductor layer comprises at least one of silicon, germanium, gallium, arsenic, indium, and antimonide. The second semiconductor layer is monocrystalline and distinct from the sacrificial semiconductor layer, in some such examples.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure, comprising:
a first fin above a substrate;
a second fin above the substrate, the second fin laterally spaced apart from the first fin by a first width;
a first isolation material structure laterally between the first fin and the second fin, the first isolation material structure having a first thickness;
a third fin above the substrate, the third fin laterally spaced apart from the second fin by a second width, the second width greater than the first width;
a second isolation material structure laterally between the second fin and the third fin, the second isolation material structure having a second thickness, the second thickness greater than the first thickness;
a fourth fin above the substrate, the fourth fin laterally spaced apart from the third fin by a third width, the third width less than the second width; and
a third isolation material structure laterally between the third fin and the fourth fin, the third isolation material structure having a third thickness, the third thickness less than the second thickness, and the third thickness greater than the first thickness.

2. The integrated circuit structure of claim 1, wherein a top of the first fin, a top of the second fin, a top of the third fin, and a top of the fourth fin are at a same level.

3. The integrated circuit structure of claim 1, wherein the first fin, the second fin, the third fin and the fourth fin have different widths.

4. The integrated circuit structure of claim 1, further comprising:
a fifth fin above the substrate, the fifth fin laterally spaced apart from the fourth fin.

5. The integrated circuit structure of claim 1, wherein a first side of the second fin has a depth different than a depth of a second side of the second fin, and wherein a first side of the third fin has a depth different than a depth of a second side of the third fin.

6. The integrated circuit structure of claim 1, wherein the second fin and the third fin have sidewalls with asymmetric taper.

7. The integrated circuit structure of claim 1, wherein the fourth fin has a width less than a width of the second fin.

8. An integrated circuit structure in a cross-sectional view, the integrated circuit structure comprising:
a first semiconductor body above a substrate;
a second semiconductor body above the substrate, the second semiconductor body laterally spaced apart from the first semiconductor body by a first pitch;
a first trough between the first semiconductor body and the second semiconductor body, the first trough having a first height;
a third semiconductor body above the substrate, the third semiconductor body laterally spaced apart from the second semiconductor body by a second pitch greater than the first pitch;
a second trough between the second semiconductor body and the third semiconductor body, the second trough having a second height;
a fourth semiconductor body above the substrate, the fourth semiconductor body laterally spaced apart from the third semiconductor body by a third pitch, the third pitch less than the second pitch; and
a third trough between the third semiconductor body and the fourth semiconductor body, the third trough having a third height less than the second height of the second trough, wherein the first height of the first trough is less than the second height of the second trough, and wherein the first height of the first trough is less than the third height of the third trough.

9. The integrated circuit structure of claim 8, wherein the third pitch is the same as the first pitch.

10. The integrated circuit structure of claim 8, wherein a top of the first semiconductor body, a top of the second semiconductor body, a top of the third semiconductor body, and a top of the fourth semiconductor body are at a same level.

11. The integrated circuit structure of claim 8, further comprising:
a first isolation material structure in the first trough, a second isolation material structure in the second trough, and a third isolation material structure in the third trough.

12. The integrated circuit structure of claim 8, wherein the first semiconductor body, the second semiconductor body, the third semiconductor body and the fourth semiconductor body have different widths.

13. The integrated circuit structure of claim 8, further comprising:
a fifth semiconductor body above the substrate, the fifth semiconductor body laterally spaced apart from the fourth semiconductor body.

14. An integrated circuit structure, comprising:
a substrate comprising silicon;
a first fin extending up from the substrate, the first fin having a top, a first side, and a second side opposite the first side;
a second fin extending up from the substrate, the second fin having a top, a first side, and a second side opposite the first side, the second fin spaced apart from the first fin;
a first isolation region between the first fin and the second fin, the first isolation region having a bottom conformal to the substrate and having a top surface;
a third fin extending up from the substrate, the third fin having a top, a first side, and a second side opposite the first side, the third fin spaced apart from the second fin;
a second isolation region between the second fin and the third fin, the second isolation region having a bottom conformal to the substrate and having a top surface;
a fourth fin extending up from the substrate, the fourth fin having a top, a first side, and a second side opposite the first side, the third fin spaced apart from the third fin; and
a third isolation region between the third fin and the fourth fin, the third isolation region having a bottom conformal to the substrate and having a top surface;
wherein in a cross section through the first, second, third, and fourth fins:
there is no fin between the first and second fin, there is no fin between the second and third fins, and there is no fin between the third and fourth fins;
a first distance between a center of the first fin and a center of the second fin defines a first pitch, a second distance between the center of the second fin and a center of the third fin is greater than the first pitch, and a third distance between the center of the third fin and a center of the fourth fin is substantially the same as the first distance;
the top of the first fin, the top of the second fin, the top of the third fin, and the top of the fourth fin are substantially along a first line;

the bottom of the first isolation region has a first lowest point farthest below the first line defined by the tops of the first fin, the second fin, the third fin, and the fourth fin;

the bottom of the second isolation region has a second lowest point farthest below the first line, the second lowest point being lower than the first lowest point; and the bottom of the third isolation region has a third lowest point farthest below the first line, the third lowest point being lower than the first lowest point, and the third lowest point being higher than the second lowest point.

15. The integrated circuit structure of claim 14, wherein the second isolation region is a single material that extends continuously from the second side of the second fin to the first side of the third fin.

16. The integrated circuit structure of claim 14, wherein the first fin has a first width measured at a first depth below the first line, the second fin has a second width measured at the first depth below the first line, and the first width is different than the second width.

17. The integrated circuit structure of claim 14, wherein the second distance between the center of the second fin and a center of the third fin is at least twice the first pitch.

18. The integrated circuit structure of claim 14, wherein in the cross section through the first, second, third, and fourth fins, the top surface of the first isolation region, the top surface of the second isolation region, and the top surface of the third isolation region are substantially along a second line.

* * * * *